Figure 1:
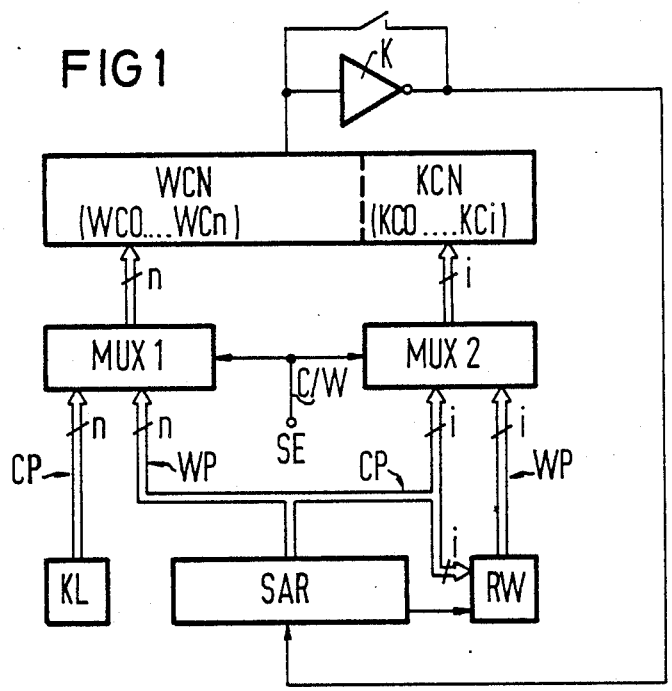

United States Patent [19]
Draxelmayr

[11] Patent Number: 4,970,515
[45] Date of Patent: Nov. 13, 1990

[54] SELF-CALIBRATING A/D AND D/A CONVERTER

[75] Inventor: Dieter Draxelmayr, Villach, Austria

[73] Assignee: Siemens Aktiengesellschaft, Munich, Fed. Rep. of Germany

[21] Appl. No.: 415,058

[22] Filed: Sep. 29, 1989

[30] Foreign Application Priority Data

Sep. 30, 1988 [EP] European Pat. Off. ........ 88116238.2

[51] Int. Cl.$^5$ ............................................. H03M 1/10
[52] U.S. Cl. ..................................... 341/120; 341/172; 341/153
[58] Field of Search ............... 341/118, 119, 153, 120, 341/121, 172

[56] References Cited

U.S. PATENT DOCUMENTS

| | | | |
|---|---|---|---|
| 4,077,035 | 2/1978 | Yee | 341/172 |
| 4,399,426 | 8/1983 | Tan. | |
| 4,517,549 | 5/1985 | Tsukakoshi | 341/172 |
| 4,679,028 | 7/1987 | Wilson et al. | 341/120 |
| 4,709,255 | 11/1987 | Welland et al. | 341/121 |
| 4,736,189 | 4/1988 | Katsumata et al. | 341/120 |

FOREIGN PATENT DOCUMENTS 0258840 3/1988 European Pat. Off. .

Primary Examiner—William M. Shoop, Jr.
Assistant Examiner—Randy Wayne Gibson
Attorney, Agent, or Firm—Herbert L. Lerner; Laurence A. Greenberg

[57] ABSTRACT

A self-calibrating A/D and D/A converter operating according to the principle of successive approximation includes a weighted converter network, a calibration and correction network, network elements and switches associated with the network elements. A control configuration controls the converter network and the calibration and correction network through the switches for performing a conversion and correction phase as well as a calibration phase. A comparator feeds the converter network and the calibration and correction network back to the control configuration. The control configuration includes a single successive approximation register for controlling the converter network and the calibration and correction network in a multiplex mode.

2 Claims, 1 Drawing Sheet

SELF-CALIBRATING A/D AND D/A CONVERTER

The invention relates to a self-calibrating A/D and D/A converter operating according to the principle of successive approximation, having a weighted converter network and a calibration and correction network which are controlled by a control configuration through switches associated with network elements for performing a conversion and correction phase as well as a calibration phase, and a comparator through which they are fed back to the control configuration.

The most important and most critical interface between different types of systems is usually the connection between analog and digital systems. The interface between a digital circuit and an analog circuit requires a D/A converter, while the interface between an analog circuit and a digital circuit correspondingly requires an A/D converter. A D/A converter can be made with the aid of an A/D converter, and vice versa. An ideal converter, which naturally does not exist in actuality, would convert a digital or analog signal, as applicable, into an analog or digital signal without delay and without error.

In many types of A/D and D/A converters, reference elements are needed, which derive further variables that are used for a conversion from a predetermined reference variable. These reference elements form a weighted network. In practice, the weighted networks are usually achieved by means of resistors, capacitors or transistors. Such converters operate, for instance, according to the method of successive approximation. A converter with charge redistribution, in which the weighted network is formed of capacitors, can be considered an example of such a converter.

A converter of that kind, which operates according to the principle of successive approximation and charge redistribution, is known from U.S. Pat. No. 4,399,426, which includes not only a weighted capacitive converter network but also at least one capacitive calibration and correction network, each being controlled by a successive approximation register. The output side of the network regions are connected to a comparator having an output which is fed back to the successive approximation register. The successive approximation registers are connected to a calculating register, with the aid of which the correction capacitances required for an ideal weighting or bit resolution for the calibration and correction network are determined and stored in memory, in a calibration operation. In a conversion operation, the calculating register then assures that the applicable correction capacitances are brought into play, with the aid of the switches associated with each capacitor of the converter. However, the method can also be performed with non-capacitive network elements.

Another option for self-calibration of A/D and D/A converters is the use of a microcomputer to ascertain the necessary error variables.

The use of a microcomputer is not worthwhile except with converters of high bit resolution, because it requires considerable space. The use of two or more successive approximation registers makes the circuitry extremely complex and means that a large surface area is required for the converter.

It is accordingly an object of the invention to provide a self-calibrating A/D and D/A converter, which overcomes the hereinafore-mentioned disadvantages of the heretofore-known devices of this general type, which has comparatively slight complexity in terms of circuitry and which requires little space.

With the foregoing and other objects in view there is provided, in accordance with the invention, a self-calibrating A/D and D/A converter operating according to the principle of successive approximation, comprising a weighted converter network, a calibration and correction network, network elements, switches associated with the network elements, a control configuration controlling the converter network and the calibration and correction network through the switches for performing a conversion and correction phase as well as a calibration phase, and a comparator through which the converter network and the calibration and correction network are fed back to the control configuration, the control configuration including a single successive approximation register with the aid of which the converter network and the calibration and correction network are controlled in a multiplex mode.

The concept on which the invention is based is the use of the same successive approximation register that is already needed for the conversion, for ascertaining the correction values as well. In this way, double use of the successive approximation register can be made.

The invention has the advantage of greatly reducing the complexity and the space needed by the converter. The invention can also be equally advantageously be used with a conventional converter, an algorithmic converter or a redundant converter.

In accordance with a concomitant feature of the invention, the successive approximation register has outputs, and the control configuration also includes a first multiplexer configuration having an output side connected to the converter network and an input side connected to an associated one of the outputs of the successive approximation register, a second multiplexer configuration having an output side connected to the calibration and correction network and an input side connected to an associated one of the outputs of the successive approximation register, a calibration logic connected to the input side of the first multiplexer configuration, and a calculating register connected to the input side of the second multiplexer configuration.

Other features which are considered as characteristic for the invention are set forth in the appended claims.

Although the invention is illustrated and described herein as embodied in a self-calibrating A/D and D/A converter, it is nevertheless not intended to be limited to the details shown, since various modifications and structural changes may be made therein without departing from the spirit of the invention and within the scope and range of equivalents of the claims. The construction and method of operation of the invention, however, together with additional objects and advantages thereof will be best understood from the following description of specific embodiments when read in connection with the accompanying drawings.

Figure 2:
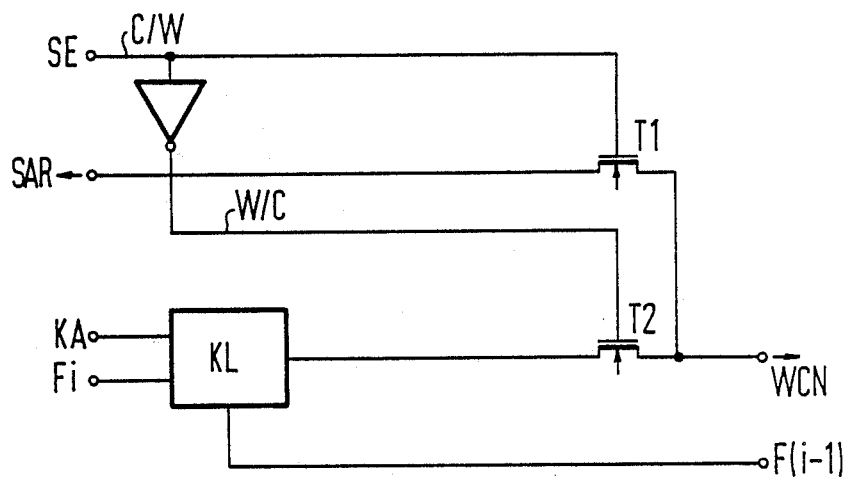

FIG. 1 is a basic schematic and block circuit diagram of an A/D converter according to the invention using the method of successive approximation; and FIG. 2 is a schematic and block circuit diagram of an exemplary embodiment of a calibration logic and a multiplexer for controlling a switch.

Referring now to the figures of the drawing in detail and first, particularly, to FIG. 1 thereof, there is seen a capacitive network of a converter which is divided into two network regions, namely a region having a weighted capacitive converter network WCN and a region having a capacitive calibration and correction network KCN with network elements WC0—WCn and KC0—KCi. The converter network WCN has a common node point, to which the calibration and correction network KCN is also connected, typically through a coupling capacitor. The node point in turn leads to a comparator K, optionally with the use of a further coupling capacitor. The output of the comparator K is carried to the input of a successive approximation register SAR. Outputs of the successive approximation register on one hand form non-illustrated outputs of the converter and on the other hand are connected to two multiplexers MUX1 and MUX2 as well as to a calculating register RW. The calculating register RW is in turn connected through lines to the multiplexer MUX2, while the multiplexer MUX1 has further inputs that are connected to a calibration logic KL. The multiplexer MUX1 has n outputs which control switches associated with n capacitors or elements of the converter network WCN, and i outputs of the multiplexer MUX2 control switches associated with i capacitors or elements of the calibration and correction network KCN. Since the number i of capacitors of the calibration and correction network KCN is typically less than the number n of capacitors of the converter network WCN, the number of outputs of the successive approximation register SAR to be carried to the multiplexer MUX2 or to the calculating register RW also need be no greater than that number. The number of connections between the calculating register RW and the multiplexer MUX2 similarly corresponds to that number.

The inputs of the two multiplexers are controlled with the aid of a control terminal SE, to which either a signal C for calibration operation CP or a signal W for conversion and correction operation WP, can be applied. If a signal C for the calibration operation is applied, the inputs of the two multiplexers corresponding to the signal C are activated and switched through. The calibration operation takes its course in a known manner. If, on the other hand, a signal W for the conversion operation is applied, then the definitive inputs of the multiplexer MUX1 for the normal conversion operation are switched through to the switches of the converter network WCN. In order to correct the capacitances of the converter network, the calculating register RW, with the aid of the multiplexer MUX2 which switches the corresponding inputs through, then triggers the necessary correction capacitors of the calibration and correction network KCN. Elements SAR, KL, RW, MUX1, MUX2 and SE form a control configuration for controlling the converter network WCN and the calibration and correction network KCN through switches associated with network elements for performing the conversion and correction phase as well as the calibration phase.

A particularly advantageous embodiment of the successive approximation register can be found in U.S. Pat. No. 4,852,130. The successive approximation register described there moreover offers the opportunity of using different word lengths in the calibration or conversion phase. The leading 1 pushed through the successive approximation register indicates the number of places already determined. Depending on the tap, a signal for cutting off the calibration or conversion operation can be generated with the aid of a flip-flop, for example.

FIG. 2 shows an exemplary embodiment of the construction of a circuit portion, associated with a switch of the converter network WCN, of the calibration logic KL and of the multiplexer MUX1. The switches are associated with the network elements mentioned above. The multiplexer portion associated with a switch of the converter network WCN is formed of two transistors T1 and T2, which function as transfer gates. Depending on the signal present at the terminal SE, either the transistor T1 or the transistor T2 is switched through. On one hand, the output circuits of the two transistors are connected to one another and to the converter network WCN. On the other hand, the output circuit of the transistor T1 is connected to one output of the successive approximation register SAR and the output circuit of the transistor T2 is connected to one output of the calibration logic KL. The calibration logic has as many stages as the number n of weighting capacitors which are contained in the converter network WCN and to be calibrated. The calibration logic is controlled by a logic potential Fi which is switched on from one stage to the next, and by a control signal KA generated by non-illustrated flow control means. With each cycle, the signal Fi is switched onward to the next stage F(i−1) in succession.

In the calibration phase, the transistor T2 switches through, and in succession all of the capacitors of the converter network WCN are compared with the respective lower-weighted capacitors of the network, and the correction capacitors or capacitances of the calibration and correction network KCN are ascertained. In the conversion phase, the transistor T2 blocks, and the outputs of the successive approximation register SAR are applied to the switches of the converter network WCN with the aid of the transistor T1.

The foregoing is a description corresponding in substance to European Application No. 88 116 238.2, dated Sept. 30, 1988, the International priority of which is being claimed for the instant application, and which is hereby made part of this application. Any material discrepancies between the foregoing specification and the aforementioned corresponding European application are to be resolved in favor of the latter.

I claim:

1. Self-calibrating A/D and D/A converter operating according to the principle of successive approximation, comprising a weighted converter network, a calibration and correction network, network elements, switches associated with said network elements, a control configuration controlling said converter network and said calibration and correction network through said switches for performing a conversion and correction phase as well as a calibration phase, and a comparator through which said converter network and said calibration and correction network are fed back to said control configuration, said control configuration including a single successive approximation register for controlling said converter network and said calibration and correction network in a multiplex mode.

2. Converter according to claim 1, wherein said successive approximation register has outputs, and said control configuration also includes a first multiplexer configuration having an output side connected to said converter network and an input side connected to an associated one of said outputs of said successive approximation register, a second multiplexer configuration having an output side connected to said calibration and correction network and an input side connected to an associated one of said outputs of said successive approximation register, a calibration logic connected to said input side of said first multiplexer configuration, and a calculating register connected to said input side of said second multiplexer configuration.

* * * * *